United States Patent
Waterloo et al.

(10) Patent No.: US 12,152,133 B2
(45) Date of Patent: Nov. 26, 2024

(54) MOLD COMPOUNDS AND PACKAGES FOR ENCAPSULATING ELECTRONIC COMPONENTS

(71) Applicant: Infineon Technologies AG, Neubiberg (DE)

(72) Inventors: Andreas Waterloo, Regensburg (DE); Stefan Schwab, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 182 days.

(21) Appl. No.: 17/502,859

(22) Filed: Oct. 15, 2021

(65) Prior Publication Data

US 2022/0127463 A1 Apr. 28, 2022

(30) Foreign Application Priority Data

Oct. 22, 2020 (DE) .................... 10 2020 127 830.6

(51) Int. Cl.
*C08L 101/12* (2006.01)
*C08K 9/12* (2006.01)
*H01L 23/29* (2006.01)

(52) U.S. Cl.
CPC .......... *C08L 101/12* (2013.01); *H01L 23/295* (2013.01)

(58) Field of Classification Search
CPC ................................ C08K 9/12; H01L 23/295
See application file for complete search history.

(56) References Cited

U.S. PATENT DOCUMENTS

| | | | | |
|---|---|---|---|---|
| 4,933,744 A | * | 6/1990 | Segawa | H01G 2/12 174/521 |
| 5,015,675 A | | 5/1991 | Walles et al. | |
| 6,225,377 B1 | * | 5/2001 | Markert | C08G 18/58 523/427 |
| 7,091,258 B2 | * | 8/2006 | Neubert | B32B 15/00 524/502 |
| 2008/0272486 A1 | | 11/2008 | Wang et al. | |
| 2010/0155934 A1 | | 6/2010 | Yim et al. | |
| 2015/0179477 A1 | | 6/2015 | Cadag et al. | |
| 2016/0064298 A1 | | 3/2016 | Teh et al. | |
| 2017/0117208 A1 | * | 4/2017 | Kasztelan | H01L 23/49562 |
| 2018/0044169 A1 | | 2/2018 | Hatcher, Jr. et al. | |

FOREIGN PATENT DOCUMENTS

| | | | | |
|---|---|---|---|---|
| CN | 108878377 A | * | 11/2018 | ............. H01L 21/56 |
| JP | H06291236 | | 10/1994 | |
| JP | 2009051824 A | * | 3/2009 | ............. C03C 3/085 |
| JP | 2018044177 | | 3/2018 | |
| JP | 2018101758 | | 6/2018 | |
| WO | 93/20585 | | 10/1993 | |

* cited by examiner

*Primary Examiner* — Vickey Nerangis
(74) *Attorney, Agent, or Firm* — Dicke, Billig & Czaja, PLLC

(57) ABSTRACT

A package and method of manufacturing a package is disclosed. In one example, a package for encapsulating an electronic component includes a first cured mold compound, wherein the first cured mold compound includes a resin and filler particles embedded in the resin. The filler particles include a second cured mold compound. The first cured mold compound is based on a first curing act and the second cured mold compound is based on a second curing act different from the first curing act.

20 Claims, 5 Drawing Sheets

MOLD COMPOUNDS AND PACKAGES FOR ENCAPSULATING ELECTRONIC COMPONENTS

CROSS-REFERENCE TO RELATED APPLICATION

This Utility Patent Application claims priority to German Patent Application No. 10 2020 127 830.6, filed Oct. 22, 2020, which is incorporated herein by reference.

TECHNICAL FIELD

The present disclosure relates to mold compounds and packages for encapsulating electronic components. In addition, the present disclosure relates to methods for manufacturing such mold compounds and packages.

BACKGROUND

Mold compounds may be used for packaging electronic components, such as e.g. semiconductor chips. In order to ensure good reliability of a molded package, properties of the applied mold compound may be adapted. For example, filler particles may affect a water uptake, a weight loss or a coefficient of thermal expansion (CTE) of the mold compound. Manufacturers of mold compounds and packaged electronic components are constantly striving to improve their products and methods for manufacturing thereof. It may be desirable to develop mold compounds and packages with improved reliability compared to standard ones. In addition, it may be desirable to provide effective methods for manufacturing such mold compounds and packages.

SUMMARY

An aspect of the present disclosure relates to a package for encapsulating an electronic component. The package comprises a first cured mold compound, wherein the first cured mold compound comprises a resin and filler particles embedded in the resin. The filler particles comprise a second cured mold compound. The first cured mold compound is based on a first curing act and the second cured mold compound is based on a second curing act different from the first curing act, wherein a glass transition temperature of the first cured mold compound differs from a glass transition temperature of the second cured mold compound.

An aspect of the present disclosure relates to a method for manufacturing a package for encapsulating an electronic component. The method comprises curing a first mold compound in a first curing act. The method further comprises separating the first cured mold compound into particles. The method further comprises embedding the particles of the first cured mold compound into an uncured second mold compound. The method further comprises generating the package by curing the second mold compound in a second curing act, wherein a glass transition temperature of the first cured mold compound differs from a glass transition temperature of the second cured mold compound.

An aspect of the present disclosure relates to a mold compound. The mold compound comprises mold pellets comprising a first pre-polymerized uncured mold compound and a second pre-polymerized mold compound, wherein the second pre-polymerized mold compound is cured, and wherein a glass transition temperature of the first pre-polymerized uncured mold compound differs from a glass transition temperature of the second pre-polymerized mold compound.

BRIEF DESCRIPTION OF THE DRAWINGS

The accompanying drawings are included to provide a further understanding of aspects. The drawings illustrate aspects and together with the description serve to explain principles of aspects. Other aspects and many of the intended benefits of aspects will be readily appreciated as they become better understood by reference to the following detailed description. The elements of the drawings are not necessarily to scale relative to each other. Like reference numerals may designate corresponding similar parts.

DETAILED DESCRIPTION

In the following detailed description, reference is made to the accompanying drawings, in which are shown by way of illustration specific aspects in which the disclosure may be practiced. Other aspects may be utilized and structural or logical changes may be made without departing from the concept of the present disclosure. Hence, the following detailed description is not to be taken in a limiting sense.

The following description specifies packages, mold compounds, and methods for manufacturing thereof in accordance with the disclosure. The devices and methods may be described in a general manner in order to qualitatively specify aspects of the disclosure. It is understood that the devices and methods may include further aspects. In particular, the devices and methods may be extended by any of the aspects described in connection with other examples in accordance with the disclosure.

Figure 1:
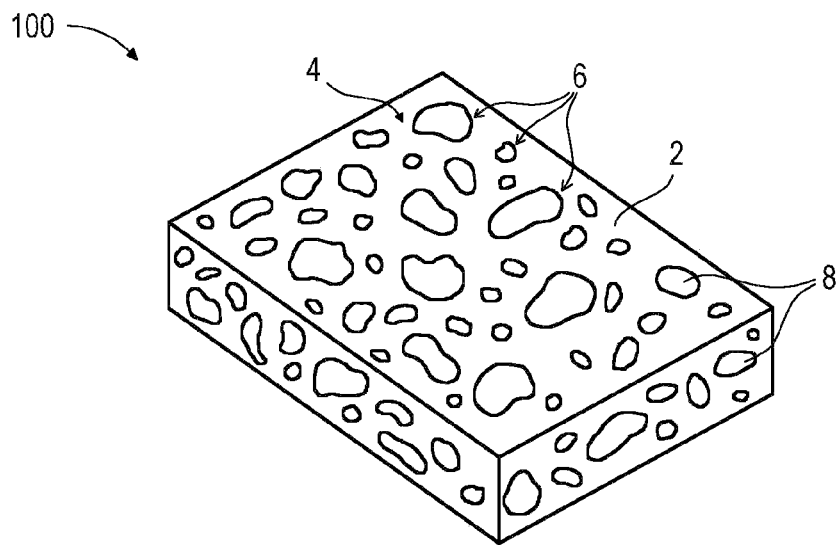
FIG. 1 schematically illustrates a perspective view of a package 100 in accordance with the disclosure.

The package 100 of FIG. 1 may be configured to encapsulate (or embed) one or more electronic components. The electronic components may thus be secured against external influences, such as e.g. humidity or mechanical impact, so that a proper functioning of the components may be ensured. The package 100 may also be referred to as housing, casing, etc. In the example of FIG. 1, the electronic components may be covered and thus hidden by the package 100. The electronic components may be seen as a part of the package 100 or not.

The package 100 may include a first cured mold compound 2, wherein the first cured mold compound 2 may include a resin 4 and filler particles 6 embedded in the resin 4. The filler particles 6 may include a second cured mold compound 8. The first cured mold compound 2 may be based on a first curing act, and the second cured mold compound 8 may be based on a second curing act different from the first curing act.

The electronic components encapsulated by the package 100 are not restricted to a specific type. For example, the electronic components may include or may correspond to at least one of a semiconductor chip, a semiconductor die, a transistor, a diode, an integrated circuit, an optoelectronic component, a memory, a central processing unit (CPU), a resistor, a capacitor, an antenna, etc.

A curing of a mold compound may result in chemical reactions that may create extensive cross-linking between polymer chains to produce an infusible and insoluble polymer network. The mold compound may be irreversibly hardened by the curing reaction. The first mold compound 2 and the second mold compound 8 may have been cured in different curing acts. In particular, the curing reaction of the second mold compound 8 may have been performed before the curing reaction of the first mold compound 2.

Each of the first mold compound 2 and second mold compound 8 may include various classes of materials. In general, a mold compound may include a resin, filler particles, and catalysts. For example, the resin may be at least one of a thermosetting polymer, an organic resin, an epoxy resin, etc. In the example of FIG. 1, the filler particles 6 may be made of the second mold compound 8. However, a mold compound may include further filler particles, for example non-melting inorganic materials like at least one of silicon oxide, aluminum oxide, aluminum nitride, silicon nitride, etc. A catalyst may be configured to accelerate a curing reaction of a mold compound.

Each of the first mold compound 2 and second mold compound 8 may have at least one glass transition temperature ($T_g$) at which the respective mold compound changes from a temperature region with a low CTE to a temperature region with a high CTE at higher temperatures or vice versa. In one example, the first cured mold compound 2 may be different from the second cured mold compound 8. In particular, the mold compounds 2 and 8 may differ in at least one of their possible ingredients previously specified. Consequently, a glass transition temperature of the first mold compound 2 may differ from a glass transition temperature of the second mold compound 8.

In one example, a glass transition temperature of the first mold compound 2 may be higher than a glass transition temperature of the second mold compound 8. In a further example, a glass transition temperature of the first mold compound 2 may be lower than a glass transition temperature of the second mold compound 8. A first glass transition temperature of a first one of the first mold compound 2 and the second mold compound 8 may be in a range from about 75° C. to about 125° C., more particular from about 85° C. to about 115° C., and even more particular from about 95° C. to about 105° C. In addition, a second glass transition temperature of the second one of the first cured mold compound 2 and the second cured mold compound 8 may be in a range from about 150° C. to about 200° C., more particular from about 160° C. to about 190° C., and even more particular from about 170° C. to about 180° C.

In one example, the first cured mold compound 2 may be similar to the second cured mold compound 8. In particular, the mold compounds 2 and 8 may have similar ingredients and/or similar glass temperature transition temperatures. However, it is to be noted that the mold compounds 2 and 8 may then still differ in that they have been cured in different curing acts. For this reason, the mold compounds 2 and 8 may differ in at least one thermogravimetric property which may be determined by means of a thermo gravimetric analysis (TGA). Examples for thermogravimetric properties of a material may include a water uptake of the material, a weight loss of the material, etc. In addition, due to the different curing reactions, the mold compounds 2 and 8 may be distinguishable in a cross section of the package 100, even when including similar ingredients. This may be because boundary surfaces may spatially separate the mold compounds 2 and 8 from each other. At a boundary surface a cross-linking structure of the first mold compound 2 may differ from a cross-linking structure of the second mold compound 8.

In one example, a water uptake (or a water absorption) of the first cured mold compound 2 may be higher than a water uptake of the second cured mold compound 8 or vice versa. In addition or alternatively, a weight loss of the first cured mold compound 2 may be higher than a weight loss of the second cured mold compound 8 or vice versa. A water uptake of a mold compound may be determined by measuring an increase in its weight over time. For example, the increase in weight (in %) may be measured at a temperature of about 85° C. and about 85% relative humidity over a period of up to about 192 hours. A measurement of the water uptake may be carried out on special test specimens of the respective mold compound. A weight loss (in %) of a mold compound may be measured after temperature storage at a temperature of about 175° C. or about 200° C. over a period of at least about 1000 hours. Again, a measurement of the weight loss may be carried out on special test specimens of the respective mold compound.

In one example, a concentration of the second cured mold compound 8 in the first cured mold compound 2 may be in a range from about 1 wt % to about 25 wt %, more particular from about 5 wt % to about 20 wt %, and even more particular from about 10 wt % to about 15 wt %. Furthermore, a maximum dimension of the (individual) filler particles 6 embedded in the first mold compound 2 may be in a range from about 50 micrometers (μm) to about 200 micrometers, more particular from about 75 micrometers to about 175 micrometers, and even more particular from about 100 micrometers to about 150 micrometers.

In one example, a CTE of a first one of the first cured mold compound 2 and the second cured mold compound 8 may be in a range from about 6 to about 8, more particular from about 6.5 to about 7.5. In addition, a CTE of the second one of the first cured mold compound 2 and the second cured mold 8 may be in a range from about 15 to about 30, more particular from about 20 to about 25. In one specific case, the concentrations and CTEs of the mold compounds 2 and 8 may be chosen such that the (overall) CTE of the package 100 may be in a range from about 14 to about 15. In another specific case, the concentrations and CTEs of the mold compounds 2 and 8 may be chosen such that the CTE of the package 100 may be in a range from about 6 to about 8.

In the example of FIG. 1, the first mold compound 2 may encapsulate the filler particles 6 made of the second mold compound 8. In further examples, each or both of the first mold compound 2 and the second mold compound 8 may include further filler particles (not illustrated) embedded in the respective mold compound. Here, the further filler particles of the first mold compound 2 may differ from the further filler particles of the second mold compound 8 or may not. In particular, the further filler particles may be made of an inorganic material, such as e.g. at least one of silicon oxide, aluminum oxide, aluminum nitride, silicon nitride, etc. In general, the filler particles may be of arbitrary shape and size. In one specific example, the further filler particles may include flake filler particles as e.g. shown and discussed in connection with FIGS. 4 and 5. A concentration of the further filler particles may have an effect on physical and/or chemical properties of the mold compound. For example, a higher filler loading of the mold compound may contribute to a lower water uptake, less weight loss at high temperature, and a higher CTE value.

In one example, the first mold compound 2 may have a high comparative tracking index (CTI) value. In particular, the first cured mold compound 2 may have a CTI value of 600V.

In one example, the package 100 may include a block copolymer material formed by the first cured mold compound 2 and the second cured mold compound 8. In such case, the package 100 may have been manufactured using a mold compound including mold pellets as described in connection with FIGS. 10 and 11.

Employing mold compounds as described in connection with FIG. 1 and in accordance with the disclosure may result in technical effects as described in the following.

A molding act may be performed at a molding temperature at which the mold compound may be in a soft state and may be applied to components that are to be encapsulated in a molded package. When the components are appropriately embedded in the (still soft) mold compound, the temperature may decrease, wherein the mold compound may cross-link in order to form a hardened package encapsulating the components. During such molding act the mold compound may shrink which may result in stress occurring between the mold compound and the encapsulated components. Here, a higher shrinkage may result in an increase of stress. In the example of FIG. 1, the second mold compound 8 may have been cross-linked in a curing act performed before the curing reaction of the first mold compound 2. That is, the second mold compound 8 may have already been shrinked before the curing reaction of the first mold compound 2 happens. As a result, a shrinkage of the first mold compound 2 when forming the package 100 may be reduced compared to a shrinkage of a mold compound not including the mold filler particles 6. Accordingly, using filler particles 6 made of a mold compound may decrease a stress between the package 100 and components encapsulated therein. It is to be noted that the shrinkage of the first mold compound 2 may also be reduced if the first mold compound 2 and the second mold compound 8 have similar ingredients and/or similar glass transition temperatures.

In some cases, a high CTE value of the package 100 may be required. For example, the CTE value of the package 100 may need to be adapted to the CTE value of copper, if the package 100 is to encapsulate parts of a copper leadframe (e.g. diepads, leads). In such case, the CTE value of the package 100 may be chosen to have a value of about 15. In order to provide such CTE value, a high resin load of the package 100 may be used which may, however, also result in an undesirable increase of the package's water uptake and weight loss. In the example of FIG. 1, such increased water uptake and weight loss of the package 100 may be omitted by choosing the filler particles 6 made of the second mold compound 8 to have a low water uptake and a low weight loss. In other words, using filler particles 6 in accordance with the disclosure may provide a high CTE value of the package 100 while maintaining low values for the package's water uptake and weight loss.

Figure 2:
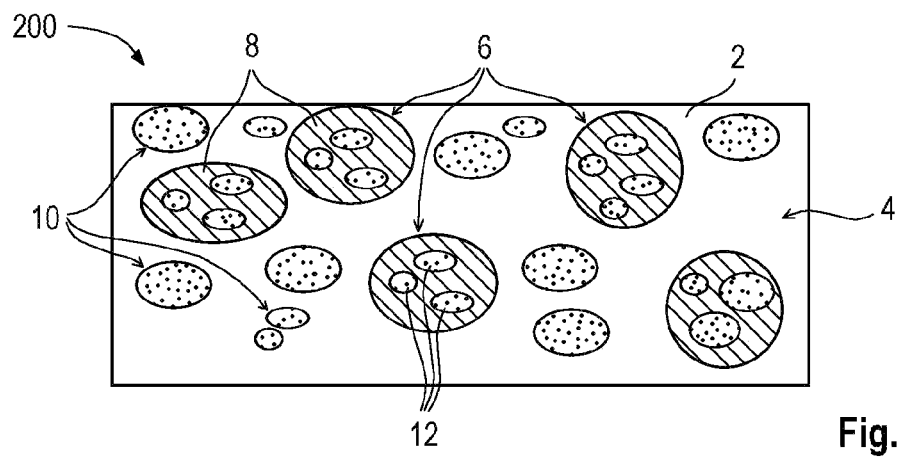
FIG. 2 schematically illustrates a cross-sectional view of a package 200 in accordance with the disclosure.

The package 200 of FIG. 2 may include some or all of the features of the package 100 of FIG. 1. Compared to FIG. 1, the first cured mold compound 2 of FIG. 2 may include further filler particles 10. Additionally or alternatively, the second mold compound 8 may include further filler particles 12. In particular, each of the further filler particles 10 and 12 may be made of an inorganic material, such as e.g. at least one of silicon oxide, aluminum oxide, aluminum nitride, silicon nitride, etc.

By using the additional filler particles, a further technical effect may be achieved. In some cases a high CTI value of the package 200 may be required, for example a CTI value of 600V. Since the peripheral surface of the package 200 may mainly consist of the resin 4, a resin material having a high CTI value may be chosen to obtain the desired high CTI value of the package 200. However, a resin 4 having a high CTI value may lead to high values of water uptake and weight loss of the package 200. In the example of FIG. 2, such bulk properties of high water uptake and high weight loss of the package 200 may be omitted by choosing the filler particles 12 of the second mold compound 8 to have a low water uptake, a low weight loss, and a high temperature stability. In other words, combining mold compounds and filler particles as e.g. shown in FIG. 2 may provide a package 200 providing a combination of a high CTI value, a high CTE value, a low water uptake, and a low weight loss.

Figure 3:
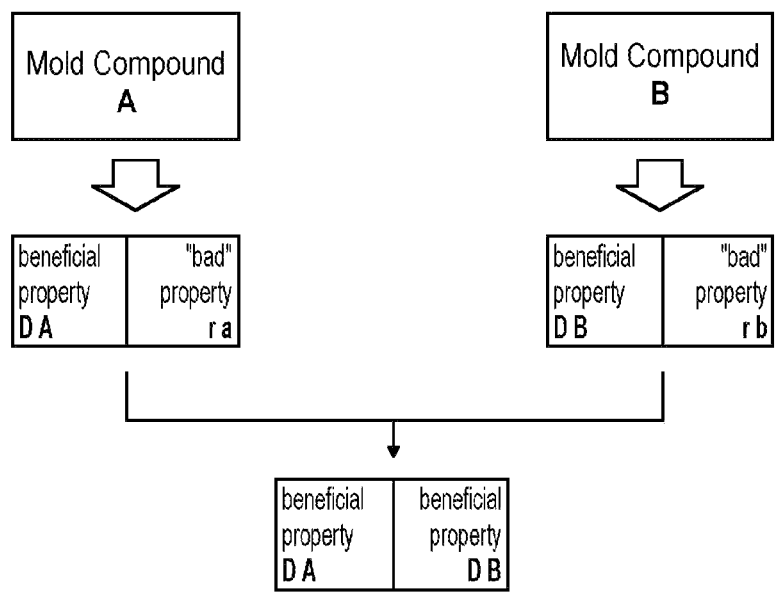
FIG. 3 is a diagram illustrating properties of a package in accordance with the disclosure.

The diagram of FIG. 3 illustrates properties of a mold compound or package in accordance with the disclosure, such as e.g. one of the packages 100 and 200 of FIGS. 1 and 2. Mold compounds A and B may correspond to the first mold compound 2 and the second mold compound 8 of FIGS. 1 and 2, respectively. The mold compound A may have one or more beneficial properties "D A" as well as one or more bad properties "r a". In a similar fashion, the mold compound B may have one or more beneficial properties "D B" as well as one or more bad properties "r b". For example, a low (high) water uptake may be regarded as a beneficial (bad) property of a mold compound in some cases. Note, however, that specifying a property as beneficial or bad may depend on the specific required properties of the package to be manufactured.

By mixing or blending the mold compounds A and B, a mold compound (or package) C may be formed as e.g. described in connection with FIGS. 1 and 2. The obtained mold compound C may provide a combination of both beneficial properties "D A" and "D B". For example, the first mold compound A may provide a high CTI value while the second mold compound B may provide a low water uptake. A package obtained by mixing mold compounds A and B may then have a high CTI value and a low water uptake at the same time.

According to FIG. 3, it may be possible to obtain a mold compound or package C having two glass transition temperatures. For example, a glass transition temperature $T_{gA}$ of the mold compound A may differ from the glass transition temperature $T_{gB}$ of the mold compound B. A mold compound C obtained by mixing the mold compounds A and B may then have both glass transition temperatures $T_{gA}$ and $T_{gB}$, which may be regarded as a beneficial property for the following reasons.

The glass transition temperature of a mold compound may represent an important property with regard to thermomechanical stress occurring between the mold compound and components embedded therein. At the glass transition temperature, the mold compound changes from a temperature region with a low CTE (CTE1) to a temperature region with a high CTE (CTE2) at higher temperatures or vice versa. In general, optimum thermomechanical properties may be obtained, if the molding temperature (substantially) corresponds to the glass transition temperature of the mold compound and the CTE1 value of the mold compound is close to the one of copper. Stress caused by cure shrinkage during the molding act may then be counterbalanced by CTE1 at lower temperatures and by CTE2 at temperatures above the molding temperature. The high CTE value (e.g. the CTE of copper of about 15) required for this approach may be achieved by increasing the resin content, which comes at the cost of a higher water uptake, higher weight loss, lower fractural strength, and a lower CTI value.

However, a possible way to overcome this problem may be the use of a material that has more than one glass transition temperature values. In this case, the thermomechanical properties may change, since three different CTE values (CTE1, CTE2, and CTE3) may be provided for such a material. This way, the properties of this mold compound may be provided such that the best properties of a material having a high glass transition temperature can be combined with a material having a low glass transition temperature which may result in an optimized material when it comes to thermomechanical performance. As explained in connection with FIG. 3, a blending of mold compounds in accordance with the disclosure may provide such mold compound (or package) having two distinct glass transition temperatures.

Figure 4:
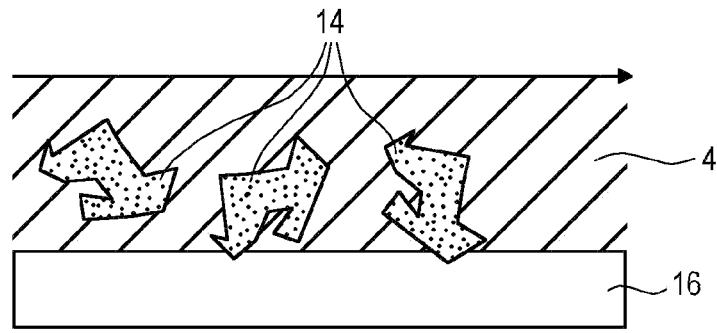
FIG. 4 illustrates an impact of flake filler particles on a mold tool during a molding act.

FIG. 4 illustrates an impact of flake filler particles 14 on a mold tool 16 during a molding act. Here, a mold compound including a resin 4 and the flake filler particles 14 may be arranged in the mold tool 16. In the example of FIG. 4, the mold compound may flow in a direction indicated by an arrow. During such mold flow sharp surfaces of the abrasive flake filler particles 14 may damage the mold tool 16 by intruding one or more of its surfaces.

Figure 5:
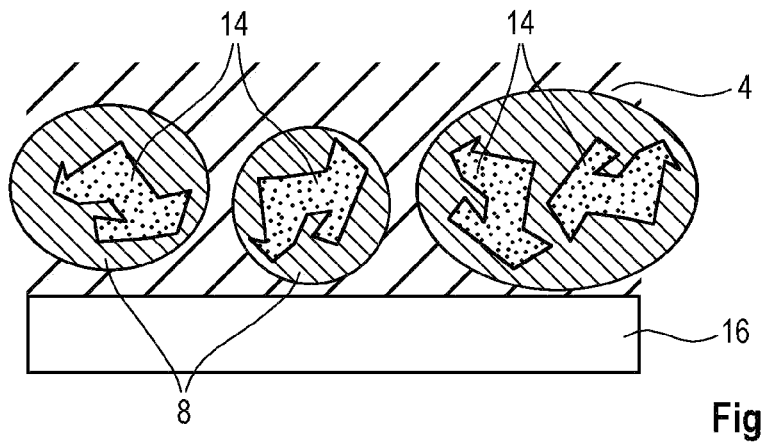
FIG. 5 illustrates an impact of flake filler particles embedded in a mold compound in accordance with the disclosure on a mold tool during a molding act.

In contrast to FIG. 4, the flake filler particles 14 shown in FIG. 5 are embedded in an additional mold compound 8 in accordance with the disclosure. The mold compound 8 may have an effect of a protective shell surrounding the flake filler particles 14 such that sharp surfaces of the flake filler particles 14 can no more intrude the surfaces of the mold tool 16. Compared to FIG. 4, the flake filler particles 14 of FIG. 15 thus show a less abrasive behavior. Employing the additional mold compound 8 may thus provide beneficial properties of flake filler particles (e.g. high flexural strength, higher CTI value, higher CTE value, etc.), while avoiding damage of the mold tool 16.

Figure 6A:
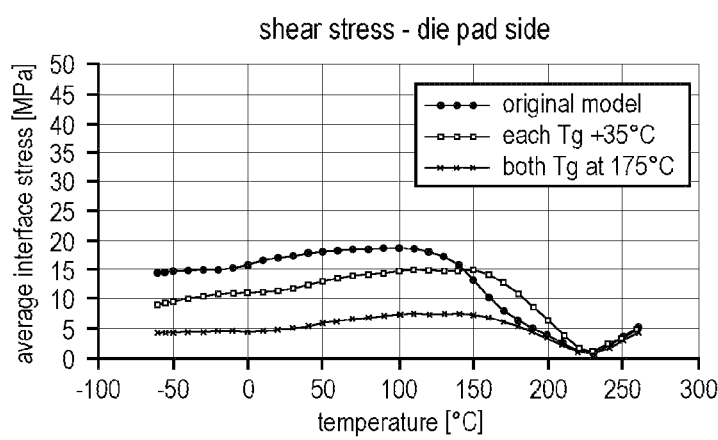
FIG. 6 includes FIGS. 6A and 6B schematically illustrating simulation results for shear stress and tensile stress occurring between different types of mold compounds and a diepad side of a leadframe.

FIG. 6A schematically illustrates simulation results for shear stress occurring between different types of mold compounds and a diepad side of a leadframe. An average interface stress (in units of MPa) is plotted against the temperature (in units of ° C.). A first curve including small dots illustrates simulation results for the case of a conventional mold compound. Here, a comparatively high shrinkage during a molding act may occur which may result in an increase of shear stress. For the case of conventional mold compounds the shear stress may be reduced by altering the glass transition temperature of the mold compound. This is illustrated by a second curve including small squares which illustrates simulation results for the case of a conventional mold compound with a different glass transition temperature compared to the first curve. A third curve including small crosses illustrates simulation results for the case of a mold compound in accordance with the disclosure as discussed in connection with foregoing figures. Due to a reduced shrinkage the shear stress between the mold compound and the diepad may be reduced.

Figure 6B:
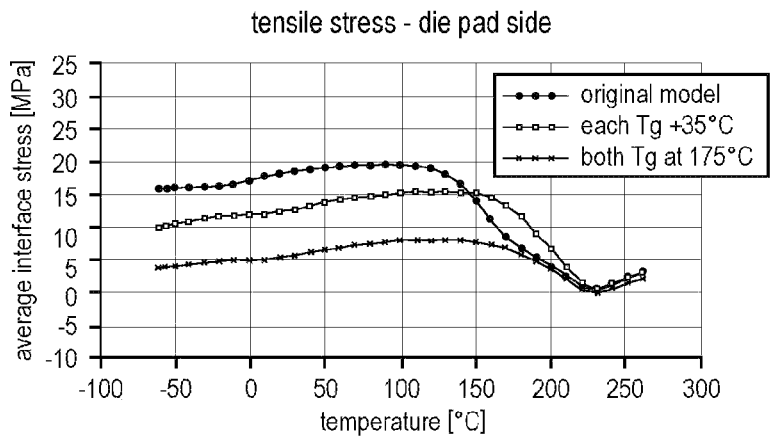

FIG. 6B schematically illustrates simulation results for tensile stress occurring between the mold compounds and the diepad side as already discussed in connection with FIG. 6A. Similar to FIG. 6A, the mold compound in accordance with the disclosure provides reduced stress values compared to the conventional mold compounds.

Figure 7A:
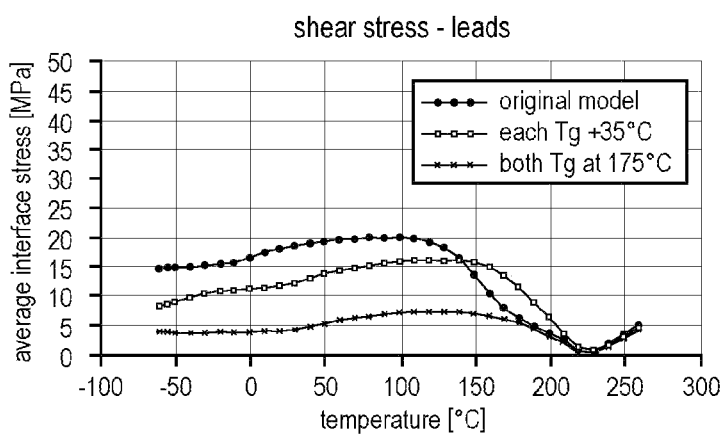
FIG. 7 includes FIGS. 7A and 7B schematically illustrating simulation results for shear stress and tensile stress occurring between different types of mold compound and leads of a leadframe.
Figure 7B:
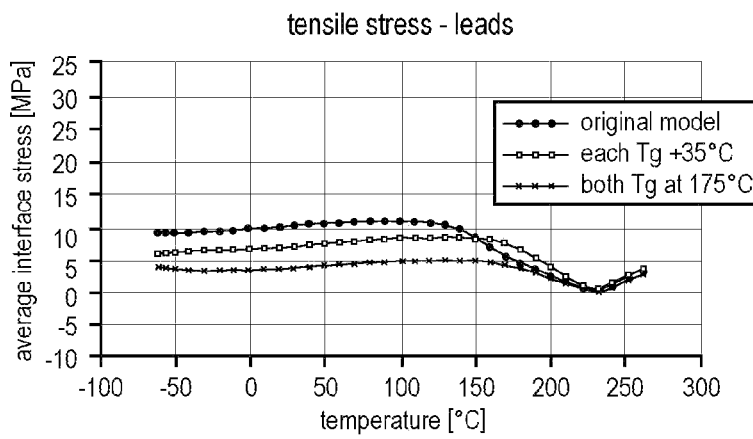

FIG. 7 includes FIGS. 7A and 7B schematically illustrating simulation results for shear stress and tensile stress occurring between different types of mold compound and leads of a leadframe. Similar to FIGS. 6A and 6B, the mold compound in accordance with the disclosure provides reduced stress compared to the conventional mold compounds.

Figure 8:
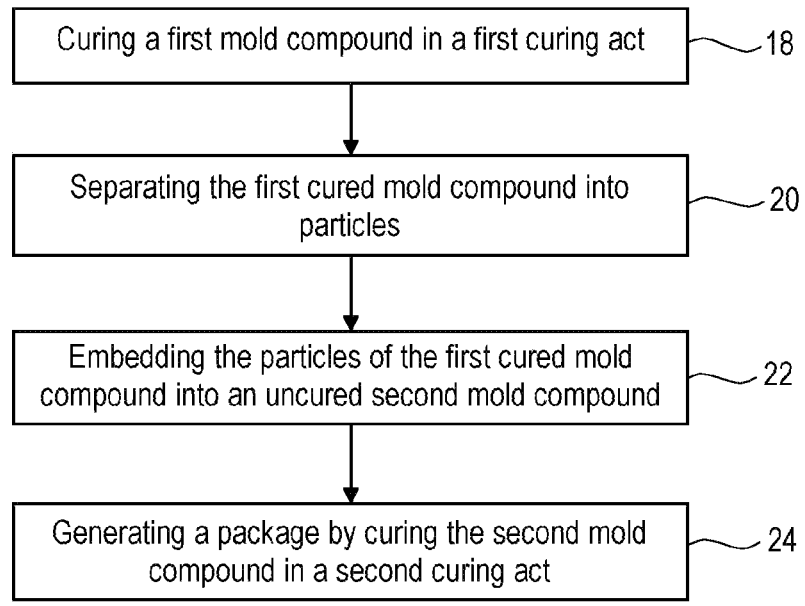
FIG. 8 illustrates a flowchart of a method for manufacturing a package for encapsulating an electronic component in accordance with the disclosure.

FIG. 8 illustrates a flowchart of a method in accordance with the disclosure for manufacturing a package for encapsulating an electronic component. For example, the method of FIG. 8 may be used for manufacturing one of the packages 100 and 200 of FIGS. 1 and 2.

At 18, a first mold compound may be cured in a first curing act. At 20, the first cured mold compound may be separated into particles. At 22, the particles of the first cured mold compound may be embedded into an uncured second mold compound. At 24, the package may be generated by curing the second mold compound in a second curing act.

Figure 9:
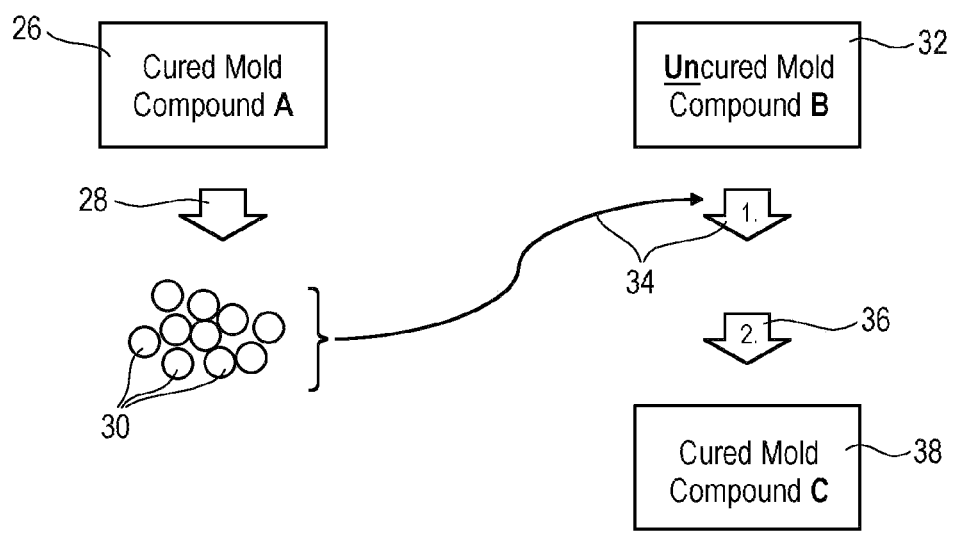
FIG. 9 illustrates a method for manufacturing a mold compound or a package for encapsulating an electronic component in accordance with the disclosure.

FIG. 9 illustrates a method for manufacturing a mold compound or a package for encapsulating an electronic component in accordance with the disclosure. The method of FIG. 9 may be seen as a more detailed version of the method of FIG. 8.

At 26, a cured mold compound A may be generated. Referring back to the example of FIG. 1, the cured mold compound A of FIG. 9 may correspond to the second mold compound 8.

At 28, the cured mold compound A may be separated into multiple mold compound particles 30. In particular, the mold compound particles 30 may be obtained by grinding the cured mold compound A. A maximum dimension of the (individual) mold compound particles 30 may be in a range from about 50 micrometers to about 200 micrometers, more particular from about 75 micrometers to about 175 micrometers, and even more particular from about 100 micrometers to about 150 micrometers.

At 32, an uncured mold compound B including a resin may be generated. Referring back to the example of FIG. 1, the uncured mold compound B of FIG. 9 may correspond to an uncured version of the first mold compound 2.

At 34, the mold compound particles 30 obtained from the cured mold compound A may be used as a filler material for the uncured mold compound B.

At 36, the mold compound B may be cured in a molding act. Note that the mold compound particles 30 embedded in mold compound B have already been cured in a previous molding act.

When the curing reaction at 36 is finalized, a cured mold compound C may be obtained at 38. Referring back to the example of FIG. 1, the cured mold compound C of FIG. 9 may correspond to the molded package 100 including the resin of the mold compound B and the mold compound particles 30 as filler particles. Referring back to FIG. 3, the cured mold compound C of FIG. 9 may represent a hybrid composite material having the properties of the mold compound A and the mold compound B.

In the following and throughout this description, the terms "pre-polymerized", "cured" and "uncured" may be used. The meaning of these terms may be based on the following comments on a mold compound fabrication process which may be based on two main acts. In a first main act, ingredients of the mold compound that is to be fabricated (i.e. resin, filler particles, catalysts, etc.) may be mixed together and pre-heated in an extruder. A heating temperature may be in a range from about 70° C. to about 120° C., more particular from about 80° C. to about 110° C., and even more particular from about 90° C. to about 100° C. During such pre-heating a pre-polymerization may occur in which first polymer chains may be formed which may be not (yet) fully hardened. In this regard, the term "pre-polymer" or "pre-polymerization" may refer to a system of monomers that have been reacted to an intermediate state. This "pre-polymerized" material may be capable of further polymerization to a fully cured state. As such, mixtures of reactive polymers with un-reacted monomers may also be referred to as pre-polymers. The pre-polymerized mold compound obtained by the extruder may be cooled down, wherein a pre-polymerized mold compound powder may be obtained. This powder may be pressed to form mold pellets or a granular material. It is noted that such mold compound powder or mold compound pellets may have been pre-polymerized, but not yet cured. Accordingly, such material may be regarded as a pre-polymerized uncured mold compound.

The second main act of the fabrication process may represent a molding act performed at a molding temperature in which the mold pellets may be melted. A molding temperature may be a range from about 160° C. to about 200° C., more particular from about 170° C. to about 190° C. The melted mold compound may be cooled down, wherein a substantially final polymerization of the mold material may occur. Since the obtained hardened and cross-linked mold compound may have been pre-polymerized in the first main act and cured in the second main act, such material may be regarded as a pre-polymerized cured mold compound. Note that an even further (and substantially total) polymerization of the mold material may be obtained by an optional post mold curing act.

Figure 10:
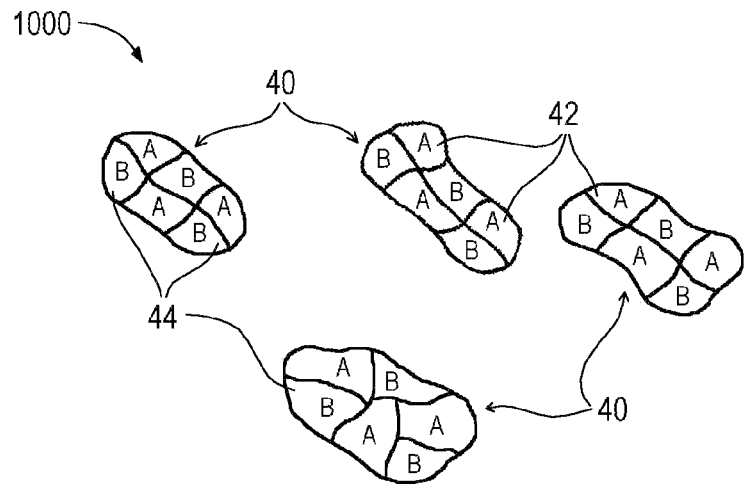
FIG. 10 schematically illustrates a mold compound 1000 including mold pellets in accordance with the disclosure.

The mold compound 1000 of FIG. 10 may include mold pellets 40 which may have been manufactured according to the above. Each of the mold pellets 40 may include a first pre-polymerized uncured mold compound 42 (see "A") and a second pre-polymerized mold compound 44 (see "B").

In one example, the second pre-polymerized mold compound 44 may be uncured, i.e. a pre-polymerization act in an extruder may have been performed for the second mold compound 44, but no curing act. In a further example, the second pre-polymerized mold compound may be cured. That is, both a pre-polymerization act in an extruder as well as a curing act may have been performed for the second mold compound 44.

A glass transition temperature of the first pre-polymerized uncured mold compound 40 may differ from a glass transition temperature of the second pre-polymerized mold compound 42. The glass transition temperature of the first mold compound 40 may be higher than the glass transition temperature of the second mold compound 42 or vice versa.

Figure 11:
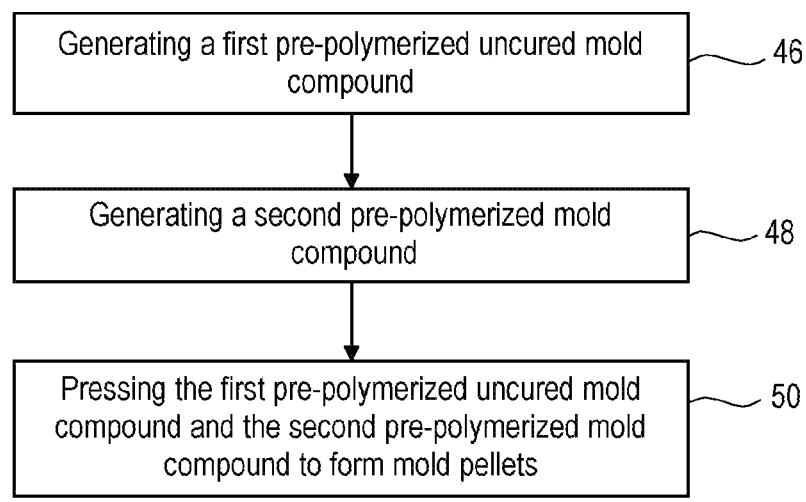
FIG. 11 illustrates a flowchart of a method for manufacturing a mold compound in accordance with the disclosure.

FIG. 11 illustrates a flowchart of a method for manufacturing a mold compound in accordance with the disclosure. For example, the method of FIG. 11 may be used for manufacturing the mold compound 1000 of FIG. 10.

At 46, a first pre-polymerized uncured mold compound may be generated. At 48, a second pre-polymerized mold compound may be generated. At 50, the first pre-polymerized uncured mold compound and the second pre-polymerized mold compound may be pressed to form mold pellets.

The first pre-polymerized uncured mold compound may be generated in form of a first powder. In particular, the first pre-polymerized uncured mold compound may be generated based on a pre-polymerization act performed in an extruder, but may be not yet cured in a molding act. The second pre-polymerized mold compound may be generated in form of a second powder. Here, the second mold compound may have been already cured in a curing process or not. The first powder and the second powder may be mixed to form a blend of the two powders. The powder blend may then be pressed to form mold pellets as e.g. shown in FIG. 10. In a subsequent molding act, the mold pellets may be finally cured to form a cured mold compound which may be a block copolymer material.

Examples

In the following, mold compounds, packages for encapsulating electronic components, and methods for manufacturing thereof will be explained by means of examples.

Example 1 is a package for encapsulating an electronic component, wherein the package comprises: a first cured mold compound, wherein the first cured mold compound comprises a resin and filler particles embedded in the resin, wherein the filler particles comprise a second cured mold compound, and wherein the first cured mold compound is based on a first curing act and the second cured mold compound is based on a second curing act different from the first curing act.

Example 2 is a package according to Example 1, wherein the first cured mold compound is different from the second cured mold compound.

Example 3 is a package according to Example 1 or 2, wherein a glass transition temperature of the first cured mold compound differs from a glass transition temperature of the second cured mold compound.

Example 4 is a package according to one of the preceding Examples, wherein: a first glass transition temperature of a first one of the first cured mold compound and the second cured mold compound is in a range from 75° C. to 125° C., and a second glass transition temperature of the second one of the first cured mold compound and the second cured mold compound is in a range from 150° C. to 200° C.

Example 5 is a package according to Example 1, wherein the first cured mold compound is similar to the second cured mold compound.

Example 6 is a package according to Example 5, wherein the first cured mold compound and the second cured mold compound differ in at least one thermogravimetric property.

Example 7 is a package according to one of the preceding Examples, wherein a concentration of the second cured mold compound in the first cured mold compound is in a range from 1 wt % to 25 wt %.

Example 8 is a package according to one of the preceding Examples, wherein a maximum dimension of the filler particles is in a range from 50 micrometers to 200 micrometers.

Example 9 is a package according to one of the preceding Examples, comprising further filler particles embedded in the second cured mold compound.

Example 10 is a package according to Example 9, wherein the further filler particles comprise flake filler particles.

Example 11 is a package according to one of the preceding Examples, wherein: a coefficient of thermal expansion of a first one of the first cured mold compound and the second cured mold compound is in a range from 6 to 8, and a coefficient of thermal expansion of the second one of the first cured mold compound and the second cured mold is in a range from 15 to 30.

Example 12 is a package according to one of the preceding Examples, wherein the first cured mold compound has a comparative tracking index value of 600V.

Example 13 is a package according to one of the preceding Examples, wherein: a water uptake of the first cured mold compound is higher than a water uptake of the second cured mold compound, and a weight loss of the first cured mold compound is higher than a weight loss of the second cured mold compound.

Example 14 is a package according to one of the preceding Examples, wherein the package comprises a block copolymer material formed by the first cured mold compound and the second cured mold compound.

Example 15 is a method for manufacturing a package for encapsulating an electronic component, wherein the method comprises: curing a first mold compound in a first curing act; separating the first cured mold compound into particles; embedding the particles of the first cured mold compound into an uncured second mold compound; and generating the package by curing the second mold compound in a second curing act.

Example 16 is a method according to Example 15, wherein separating the first cured mold compound into particles comprises grinding the first cured mold compound.

Example 17 is a mold compound, comprising: mold pellets comprising a first pre-polymerized uncured mold compound and a second pre-polymerized mold compound.

Example 18 is a mold compound according to Example 17, wherein the second pre-polymerized mold compound is uncured.

Example 19 is a mold compound according to Example 17, wherein the second pre-polymerized mold compound is cured.

Example 20 is a mold compound according to one of Examples 17 to 19, wherein a glass transition temperature of the first pre-polymerized uncured mold compound differs from a glass transition temperature of the second pre-polymerized mold compound.

To the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features.

Moreover, the words "exemplary" or "example" are used herein to mean serving as an example, instance, or illustration. Any aspect or design described herein as "exemplary" or "example" is not necessarily to be construed as advantageous over other aspects or designs. Rather, use of the words exemplary or example is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this description and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or multiple other features of the other implementations as may be desired and advantageous for any given or particular application.

The invention claimed is:

1. A package for encapsulating an electronic component, wherein the package comprises:
 a first cured mold compound for encapsulating the electronic component, wherein the first cured mold compound comprises a resin and filler particles embedded in the resin;
 wherein the filler particles comprise a second cured mold compound;
 further filler particles embedded in the second cured mold compound;
 wherein the first cured mold compound is based on a first curing act and the second cured mold compound is based on a second curing act different from the first curing act and performed before the first curing act, wherein a glass transition temperature of the first cured mold compound differs from a glass transition temperature of the second cured mold compound;
 wherein each filler particle comprising the second cured mold compound comprises a surface formed by the second cured mold compound;
 wherein a first glass transition temperature of one of the first cured mold compound or the second cured mold compound is in a range from 75° C. to 125° C.; and
 wherein a second glass transition temperature of another one of the first cured mold compound or the second cured mold compound is in a range from 150° C. to 200° C.

2. The package of claim 1, wherein the further filler particles comprise flake filler particles.

3. The package of claim 1, wherein:
- a water uptake of the first cured mold compound is higher than a water uptake of the second cured mold compound; and
- a weight loss of the first cured mold compound over a period is higher than a weight loss of the second cured mold compound over the period.

4. The package of claim 1, wherein a concentration of the second cured mold compound in the first cured mold compound is in a range from 1 wt % to 25 wt %.

5. The package of claim 1, wherein a maximum dimension of the filler particles is in a range from 50 micrometers to 200 micrometers.

6. The package of claim 1, wherein:
- a coefficient of thermal expansion of a one of the first cured mold compound or the second cured mold compound is in a range from 6 to 8 ppm/K; and
- a coefficient of thermal expansion of another one of the first cured mold compound or the second cured mold compound is in a range from 15 to 30 ppm/K.

7. The package of claim 1, wherein the first cured mold compound has a comparative tracking index value of 600V.

8. A package for encapsulating an electronic component, wherein the package comprises:
- a first cured mold compound for encapsulating the electronic component, wherein the first cured mold compound comprises a resin and filler particles embedded in the resin;
- wherein the filler particles comprise a second cured mold compound;
- further filler particles embedded in the second cured mold compound;
- wherein the first cured mold compound is based on a first curing act and the second cured mold compound is based on a second curing act different from the first curing act and performed before the first curing act, wherein a glass transition temperature of the first cured mold compound differs from a glass transition temperature of the second cured mold compound;
- wherein each filler particle comprising the second cured mold compound comprises a surface formed by the second cured mold compound; and
- wherein a concentration of the second cured mold compound in the first cured mold compound is in a range from 1 wt % to 25 wt %.

9. The package of claim 8, wherein a maximum dimension of the filler particles is in a range from 50 micrometers to 200 micrometers.

10. The package of claim 8, wherein the further filler particles comprise flake filler particles.

11. The package of claim 8, wherein:
- a coefficient of thermal expansion of a one of the first cured mold compound or the second cured mold compound is in a range from 6 to 8 ppm/K; and
- a coefficient of thermal expansion of another one of the first cured mold compound or the second cured mold compound is in a range from 15 to 30 ppm/K.

12. The package of claim 8, wherein the first cured mold compound has a comparative tracking index value of 600V.

13. The package of claim 8, wherein:
- a water uptake of the first cured mold compound is higher than a water uptake of the second cured mold compound; and
- a weight loss of the first cured mold compound over a period is higher than a weight loss of the second cured mold compound over the period.

14. A package for encapsulating an electronic component, wherein the package comprises:
- a first cured mold compound for encapsulating the electronic component, wherein the first cured mold compound comprises a resin and filler particles embedded in the resin;
- wherein the filler particles comprise a second cured mold compound;
- further filler particles embedded in the second cured mold compound;
- wherein the first cured mold compound is based on a first curing act and the second cured mold compound is based on a second curing act different from the first curing act and performed before the first curing act, wherein a glass transition temperature of the first cured mold compound differs from a glass transition temperature of the second cured mold compound;
- wherein each filler particle comprising the second cured mold compound comprises a surface formed by the second cured mold compound; and
- wherein a maximum dimension of the filler particles is in a range from 50 micrometers to 200 micrometers.

15. The package of claim 14, wherein the further filler particles comprise flake filler particles.

16. The package of claim 14, wherein:
- a coefficient of thermal expansion of a one of the first cured mold compound or the second cured mold compound is in a range from 6 to 8 ppm/K; and
- a coefficient of thermal expansion of another one of the first cured mold compound or the second cured mold compound is in a range from 15 to 30 ppm/K.

17. The package of claim 14, wherein:
- a water uptake of the first cured mold compound is higher than a water uptake of the second cured mold compound; and
- a weight loss of the first cured mold compound over a period is higher than a weight loss of the second cured mold compound over the period.

18. The package of claim 1, A package for encapsulating an electronic component, wherein the package comprises:
- a first cured mold compound for encapsulating the electronic component, wherein the first cured mold compound comprises a resin and filler particles embedded in the resin;
- wherein the filler particles comprise a second cured mold compound;
- further filler particles embedded in the second cured mold compound;
- wherein the first cured mold compound is based on a first curing act and the second cured mold compound is based on a second curing act different from the first curing act and performed before the first curing act, wherein a glass transition temperature of the first cured mold compound differs from a glass transition temperature of the second cured mold compound;
- wherein each filler particle comprising the second cured mold compound comprises a surface formed by the second cured mold compound;
- wherein a coefficient of thermal expansion of a one of the first cured mold compound or the second cured mold compound is in a range from 6 to 8 ppm/K; and
- wherein a coefficient of thermal expansion of another one of the first cured mold compound or the second cured mold compound is in a range from 15 to 30 ppm/K.

19. The package of claim 18, wherein:
- a water uptake of the first cured mold compound is higher than a water uptake of the second cured mold compound; and
- a weight loss of the first cured mold compound over a period is higher than a weight loss of the second cured mold compound over the period.

20. A package for encapsulating an electronic component, wherein the package comprises:
- a first cured mold compound for encapsulating the electronic component, wherein the first cured mold compound comprises a resin and filler particles embedded in the resin;
- wherein the filler particles comprise a second cured mold compound;
- further filler particles embedded in the second cured mold compound;
- wherein the first cured mold compound is based on a first curing act and the second cured mold compound is based on a second curing act different from the first curing act and performed before the first curing act, wherein a glass transition temperature of the first cured mold compound differs from a glass transition temperature of the second cured mold compound;
- wherein each filler particle comprising the second cured mold compound comprises a surface formed by the second cured mold compound; and
- wherein the first cured mold compound has a comparative tracking index value of 600V.

* * * * *

UNITED STATES PATENT AND TRADEMARK OFFICE
CERTIFICATE OF CORRECTION

PATENT NO. : 12,152,133 B2  
APPLICATION NO. : 17/502859  
DATED : November 26, 2024  
INVENTOR(S) : Waterloo et al.

Page 1 of 1

It is certified that error appears in the above-identified patent and that said Letters Patent is hereby corrected as shown below:

In the Claims

Column 14, Line 41, delete "The package of claim 1, A package for encapsulating" and insert in place thereof --A package for encapsulating--.

Signed and Sealed this  
Eighteenth Day of February, 2025

Coke Morgan Stewart  
*Acting Director of the United States Patent and Trademark Office*